US006010932A

United States Patent [19]
Schoenfeld et al.

[11] Patent Number: 6,010,932
[45] Date of Patent: Jan. 4, 2000

[54] FORK-LIKE MEMORY STRUCTURE FOR ULSI DRAM AND METHOD OF FABRICATION

[75] Inventors: Aaron Schoenfeld; Manny Kin F. Ma, both of Boise, Id.

[73] Assignee: Micron Technology, Inc., Boise, Id.

[21] Appl. No.: 08/759,464

[22] Filed: Dec. 5, 1996

[51] Int. Cl.[7] .............................................. H01L 21/8242
[52] U.S. Cl. ........................... 438/253; 438/396; 438/947
[58] Field of Search .................... 438/396, 947, 438/253, 254, 397; 257/306, 307, 308

[56] References Cited

U.S. PATENT DOCUMENTS

| | | | |
|---|---|---|---|
| 5,061,650 | 10/1991 | Dennison et al. | 438/253 |
| 5,292,677 | 3/1994 | Dennison | 438/396 |
| 5,338,700 | 8/1994 | Dennison et al. | 438/253 |
| 5,340,763 | 8/1994 | Dennison | 438/396 |
| 5,340,765 | 8/1994 | Dennison et al. | 438/398 |
| 5,362,666 | 11/1994 | Dennison | 438/396 |
| 5,429,980 | 7/1995 | Yang et al. | 438/396 |
| 5,438,013 | 8/1995 | Kim et al. | 438/396 |
| 5,457,063 | 10/1995 | Park | 438/396 |
| 5,459,094 | 10/1995 | Jun | 438/254 |
| 5,459,095 | 10/1995 | Huang et al. | 438/396 |
| 5,491,356 | 2/1996 | Dennison et al. | 257/306 |
| 5,494,841 | 2/1996 | Dennison et al. | 438/210 |
| 5,508,223 | 4/1996 | Tseng | 438/396 |
| 5,733,808 | 3/1998 | Tseng | 438/396 |

*Primary Examiner*—Peter Toby Brown
*Assistant Examiner*—Toniae M. Thomas
*Attorney, Agent, or Firm*—Trask, Britt & Rossa

[57] ABSTRACT

A masking and etching technique during the formation of a memory cell capacitor which simultaneously separates storage poly into individual storage poly nodes and etches recesses into the storage poly nodes which increase the surface area of the storage poly nodes and thereby increase the capacitance of a completed memory cell without additional processing steps.

12 Claims, 5 Drawing Sheets

FORK-LIKE MEMORY STRUCTURE FOR ULSI DRAM AND METHOD OF FABRICATION

BACKGROUND OF THE INVENTION

1. Field of the Invention

The present invention relates to a memory cell or storage capacitor and method for forming the memory cell capacitor. More particularly, the present invention relates to a one-step masking and etching technique which simultaneously separates storage poly into individual storage poly nodes and etches recesses into the storage poly node to increase the surface area of the storage poly node.

2. State of the Art

A widely-utilized DRAM (Dynamic Random Access Memory) manufacturing process utilizes CMOS (Complimentary Metal Oxide Semiconductor) technology to produce DRAM circuits which comprise an array of unit memory cells, each including one capacitor and one transistor, such as a field effect transistor ("FET"). In the most common circuit designs, one side of the transistor is connected to one side of the capacitor, the other side of the transistor and the transistor gate are connected to external circuit lines called the bit line and the word line, and the other side of the capacitor is connected to a reference voltage that is typically ½ the internal circuit voltage. In such memory cells, an electrical signal charge is stored in a storage node of the capacitor connected to the transistor, which opens and closes to charge and discharge the circuit lines of the capacitor.

Higher performance, lower cost, increased miniaturization of components, and greater packaging density of integrated circuits are ongoing goals of the computer industry. The advantages of increased miniaturization of components include: reduced-bulk electronic equipment, improved reliability by reducing the number of solder or plug connections, lower assembly and packaging costs, and improved circuit performance. In pursuit of increased miniaturization, DRAM chips have been continually redesigned to achieve ever higher degrees of integration. However, as the dimensions of the DRAM chips are reduced, the occupation area of each unit memory cell of a DRAM chip must be reduced. This reduction in occupied area necessarily results in a reduction of the dimensions of the capacitor, which in turn, makes it difficult to ensure required storage capacitance for transmitting a desired signal without malfunction. However, the ability to densely pack the unit memory cells while maintaining required capacitance levels is a crucial requirement of semiconductor manufacturing if future generations of DRAM chips are to be successfully manufactured.

In order to minimize such a decrease in storage capacitance caused by the reduced occupied area of the capacitor, the capacitor should have a relatively large surface area within the limited region defined on a semiconductor substrate. The drive to produce smaller DRAM circuits has given rise to a great deal of capacitor development. However, for reasons of available capacitance, reliability, and ease of fabrication, most capacitors are stacked capacitors in which the capacitor covers nearly the entire area of a cell and in which vertical portions of the capacitor contribute significantly to the total charge storage capacity. In such designs, the side of the capacitor connected to the transistor is generally called the "storage node" or "storage poly" since the material out of which it is formed is doped polysilicon, while the polysilicon layer defining the side of the capacitor connected to the reference voltage mentioned above is called the "cell poly".

Furthermore, a variety of methods are used for increasing the surface area of the capacitor. These methods include forming the capacitor with various three-dimensional shapes extending from the capacitor. Such shapes include fins, cylinders, and cubes, as well as forming rough or irregular surfaces on these shapes.

FIGS. 7–10 illustrate a prior art technique for forming a capacitor for a memory cell. FIG. 7 illustrates an intermediate structure 200 in the production of a memory cell. This intermediate structure 200 comprises a substrate 202, such as a lightly doped P-type crystal silicon substrate, which has been oxidized to form thick field oxide areas 204 and exposed to implantation processes to form drain regions 208 and a source region 210 of N+ doping. Transistor gate members 212 are formed on the surface of the substrate 202 and span between the drain regions 208 and source region 210. The transistor gate members 212 each comprise a thin gate oxide layer 206 separating a gate conducting layer or wordline 216 of the transistor gate member 212 from the substrate 202. Transistor insulating spacer members 218 are formed on either side of each transistor gate member 212. A lower insulating layer 220 is applied over the transistor gate members 212 and the substrate 202. After application, the lower insulating layer 220 is planarized.

The planarized lower insulating layer 220 is then masked and etched to form a channel therethrough to the source region 210. A bitline 222 is then formed to contact the source region 210 and extend to other source regions (not shown) on the planarized surface 224 of the planarized lower insulating layer 220. An upper insulating layer 226 is then applied over the lower insulating layer 220 and the bitlines 222. After application, the upper insulating layer 226 is planarized.

The planarized upper insulating layer 226 is then masked and etched to form channels through the upper insulation layer 226 and the lower insulating layer 220 to respective drain regions 208. A storage poly 228 is then deposited over the planarized upper insulating layer 226 such that the storage poly 228 extends through the channels to contact the drain regions 208.

As shown in FIG. 8, the storage poly 228 is then masked with a resist layer 230 and etched to separate the storage poly 228 into storage poly nodes 232 (shown in FIG. 9). A capacitor or cell dielectric 234 is deposited over the storage poly nodes 232 and the upper insulating layer 226. A cell poly or plate electrode 236 is then disposed over the capacitor dielectric 234 to form the capacitor 238 of each memory cell, as shown in FIG. 10.

If the surface area of the capacitor 238 needs to be increased, further processing steps would be required to form an irregular or rough surface on the storage poly nodes 232 prior to the addition of the capacitor dielectric 234 and the cell poly electrode 236.

U.S. Pat. No. 5,457,063 issued Oct. 10, 1995 to Park ("the Park patent") teaches a method of increasing the surface area of a capacitor. The Park patent illustrates a prior art method of first etching recesses in the polysilicon layer to form the storage poly nodes, then again etching the polysilicon layer to separate individual storage poly nodes. The Park patent teaches using the same prior art two step method to form the storage poly nodes, but also forms polysilicon sidewalls to exploit the empty space around the periphery of the storage poly node. Although both the prior art method and the method of the Park patent increase the surface area of a capacitor, each require numerous processing steps to achieve this goal. The additional process steps result in increased production costs which, in turn, result in increased semiconductor chip costs.

Therefore, it would be advantageous to develop a technique for forming a high surface area capacitor, while using inexpensive, commercially-available, widely-practiced semiconductor device fabrication techniques and apparatus without requiring such additional processing steps.

SUMMARY OF THE INVENTION

The present invention is a one-step masking and etching technique utilized during the formation of a memory cell capacitor which simultaneously separates storage poly into individual storage poly nodes and which etches recesses into each storage poly node in order to increase the surface area of the storage poly node. The increase in the storage poly node surface area increases memory cell capacitance to an adequate degree without additional processing steps. Thus, the overall size of the storage poly node can be reduced while maintaining a predetermined capacitance, which feature ultimately results in higher density DRAMs.

The method of the present invention occurs after formation of an intermediate structure comprising transistor gates on a silicon substrate which has been oxidized to form thick field oxide areas and exposed to implantation processes to form drain and source regions. The intermediate structure further comprises a lower insulating layer which substantially covers the transistor gates and the silicon substrate. Bitlines are formed on the lower insulating layer and extend through the lower insulating layer to contact the silicon substrate source regions. The intermediate structure also includes an upper insulating layer covering the lower insulating layer and the bitlines. A storage poly layer covers the upper insulating layer and extends through the upper insulating layer and lower insulating layer to contact the silicon substrate drain regions, completing the intermediate structure.

The method of the present invention comprises simultaneously etching the storage poly to separate the storage poly into storage poly nodes and etching recesses into the storage poly nodes to increase the surface area of the storage poly nodes. The simultaneous etching is achieved with a mask or resist pattern which has apertures for separating the storage into storage poly nodes and at least one recess forming aperture positioned over each storage poly node. The size (i.e., width, diameter, or surface area) of the recess apertures should be less than the size (i.e., width, diameter, or surface area) of the separation apertures. With the recess apertures smaller than the separation apertures, the etching solution has a lower diffusion rate in the recess apertures than the separation apertures. Thus etching occurs more slowly in the recess apertures than the separation apertures. Therefore, when the etching step to separate the storage poly into storage poly nodes is complete, the etching in the recess apertures will merely create recesses in the storage poly rather than etching completely through. The recess apertures can be of any shape, size, and/or density to achieve a desired surface area of the storage poly nodes.

Once the storage poly node is etched, a capacitor or cell dielectric is deposited over the storage poly node and the upper insulation layer. A cell poly or plate electrode is then disposed over the capacitor dielectric to form the capacitor of each memory cell.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
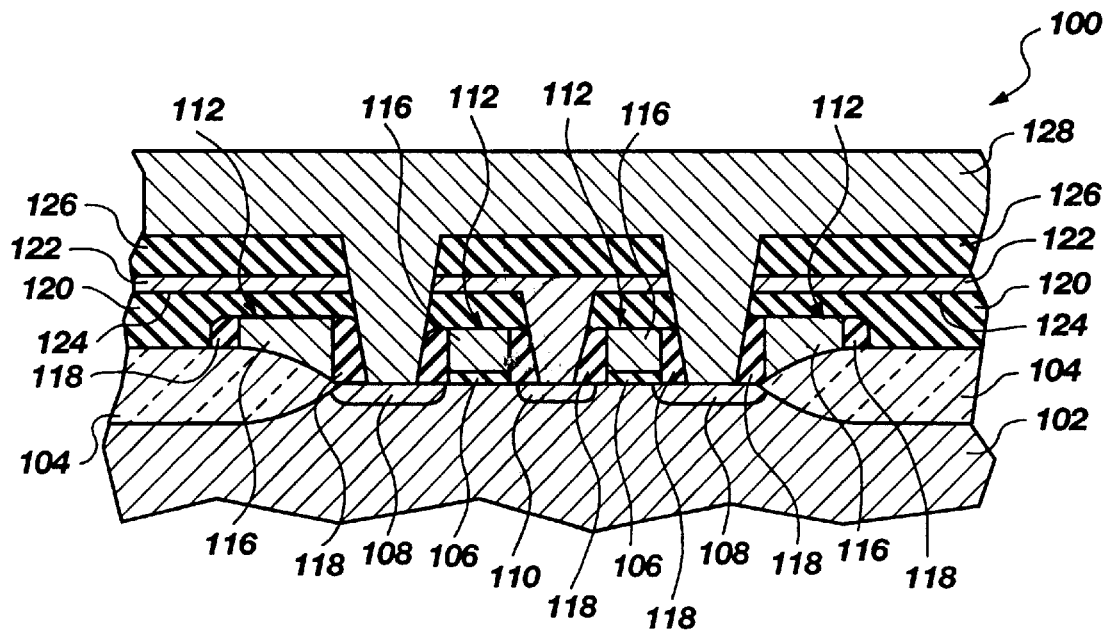
FIGS. 1–4 illustrate a method of fabricating a forked capacitor for a memory cell according to the present invention.

FIGS. 1–4 illustrate a technique for forming a forked capacitor for a memory cell. FIG. 1 illustrates an intermediate structure 100 in the production of a memory cell. This intermediate structure 100 comprises a semiconductor substrate 102, such as a lightly doped P-type crystal silicon substrate, which has been oxidized to form thick field oxide areas 104 and exposed to implantation processes to form drain regions 108 and a source region 110 of N+ doping. Transistor gate members 112 are formed on the surface of the semiconductor substrate 102 between the drain regions 108 and the source region 110. The transistor gate members 112 each comprise a patterned thin gate oxide layer 106 (preferably silicon dioxide) separating a gate conducting layer or wordline 116 of the transistor gate member 112 and the semiconductor substrate 102. Transistor insulating spacer members 118, preferably silicon dioxide, are formed on either side of each transistor gate member 112. A lower insulating layer 120 (such as boro-phospho-silicate glass—BPSG, silicon nitride, silicon dioxide, etc.) is applied over the transistor gate members 112 and the semiconductor substrate 102. After application, the lower insulating layer 120 is planarized, preferably by abrasion, such as with a CMP (chemical/mechanical polishing) process, as known in the art.

The planarized lower insulating layer 120 is then masked and etched to form a channel therethrough to the source region 110. A bitline 122 is then formed to contact the source region 110 and extend to other source regions (not shown) on the planarized surface 124 of the planarized lower insulating layer 120. An upper insulating layer 126 is then applied over the lower insulating layer 120 and the bitlines 122. After application, the upper insulating layer 126 is also planarized.

The planarized upper insulating layer 126 is then masked and etched, preferably utilizing a storage node poly photomask process as known in the art, to form channels through the upper insulating layer 126 and the lower insulation layer 120 to respective drain regions 108. A storage poly 128, such as doped silicon, is then deposited over the planarized upper insulating layer 126 such that the storage poly 128 extends through the channels to contact the drain regions 108.

Figure 2:
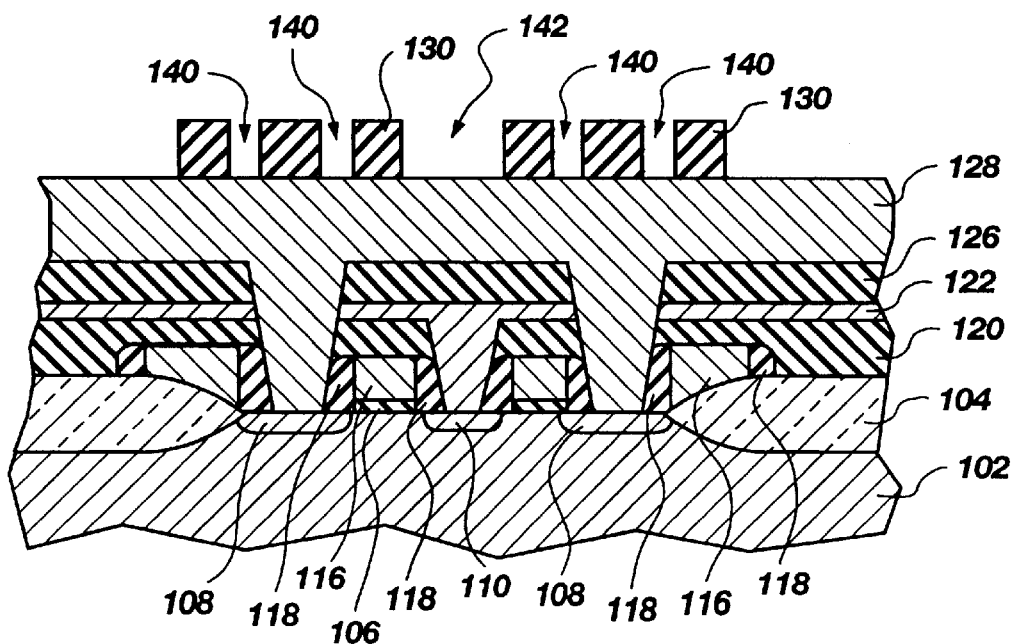
Figure 3:
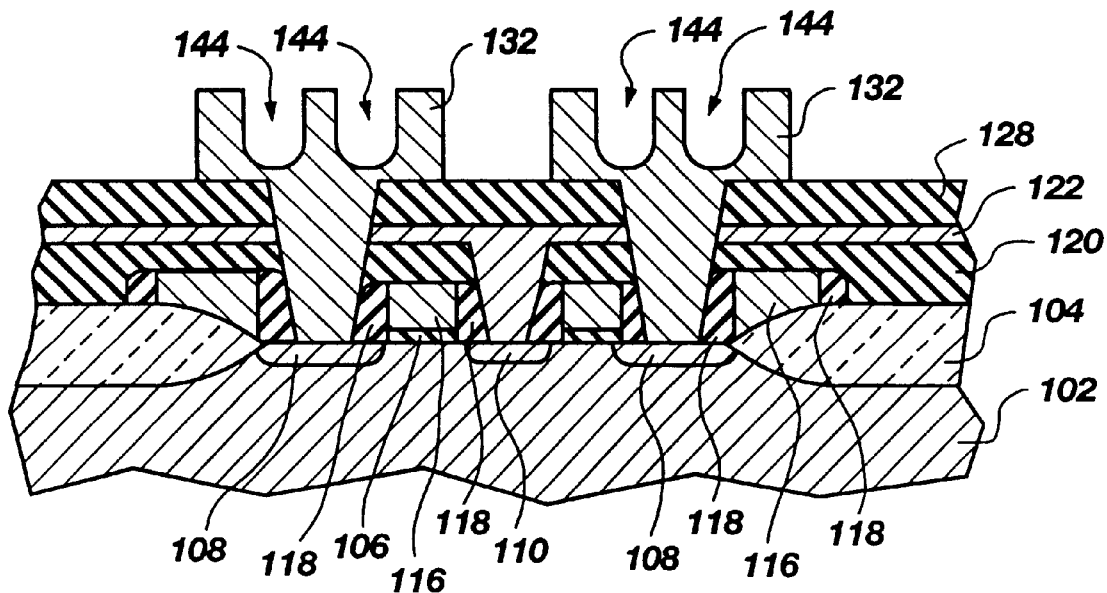

The storage poly 128 is masked and etched to separate the storage poly 128 into storage poly nodes 132. However, as shown in FIGS. 2 and 3, the present invention differs from previously known manufacturing techniques in that the mask 130 or resist used to separate the storage poly 128 into storage poly nodes 132 includes at least one aperture 140 positioned over the proposed or intended location of each storage poly node 132. The area of the apertures 140 should be less than the area of boundary openings 142 in the mask 130 for separating the storage poly 128 into storage poly nodes 132. With the apertures 140 being smaller than the boundary openings 142, the etching solution has a lower diffusion rate in the apertures 140 than in the boundary openings 142, thus the etching occurs more slowly in the apertures 140 than the boundary openings 142. Therefore, when the etching step conducted through boundary openings 142 to separate the storage poly 128 into storage poly nodes 132 is complete, the etching conducted through the apertures 140 will merely create recesses 144 in the storage poly 128 rather than etch completely therethrough. It is, of course, understood that the apertures 140 can be of any shape (circular, triangular, rectangular, etc.), size, and/or dimension to achieve a desired surface area on the storage poly nodes 132.

Figure 4:
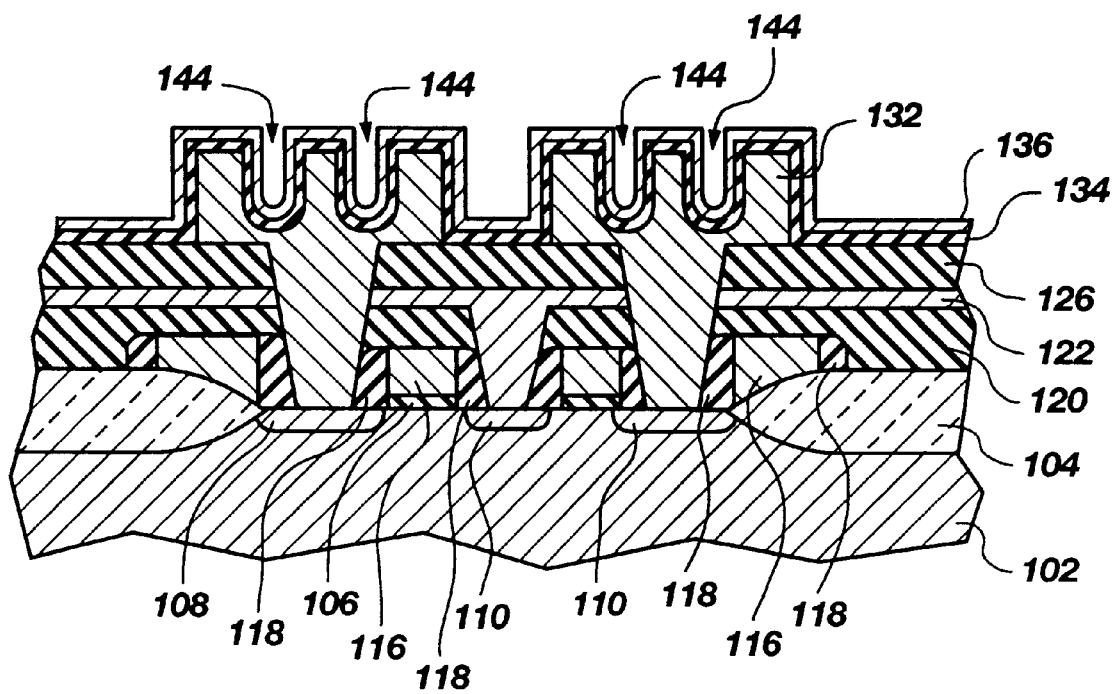

As shown in FIG. 4, a capacitor or cell dielectric 134, preferably silicon dioxide, silicon nitride or the like, is subsequently deposited over the storage poly nodes 132 and the upper insulating layer 126. A cell poly or plate electrode 136 is disposed over the capacitor dielectric 134 to form the capacitor 138 of each memory cell.

The formation of the recesses 144 in the storage poly nodes 132 results in an increase in the surface area of the capacitor 138. This results in lower refresh rates, easier sensing of the contents of the cell due to a greater potential difference between bit lines, and a reduction in the pitch constraints on the layout of the memory cells due to smaller capacitors fabricated by the method of the present invention being able to achieve a predetermined capacitance.

Figure 5:
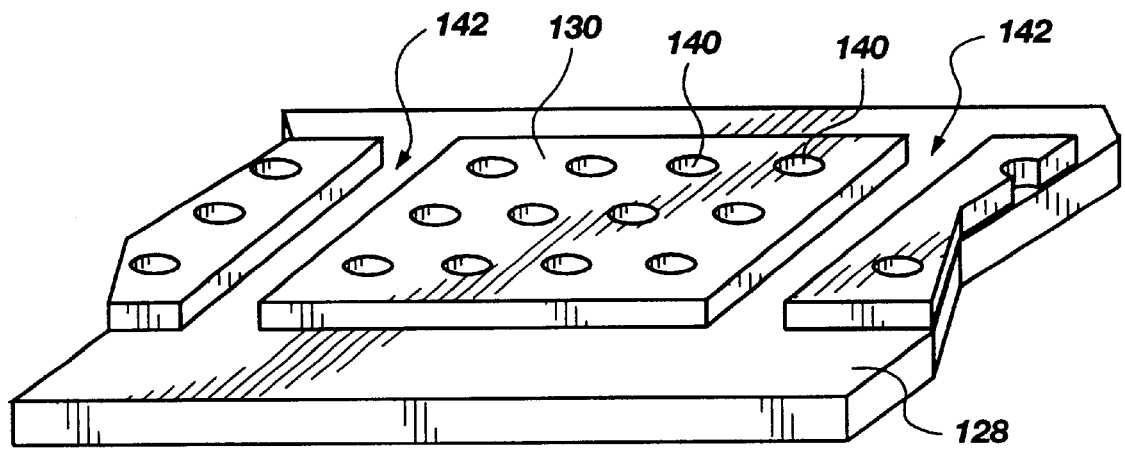
FIG. 5 illustrates an oblique view of an etching mask of the present invention.
Figure 6:
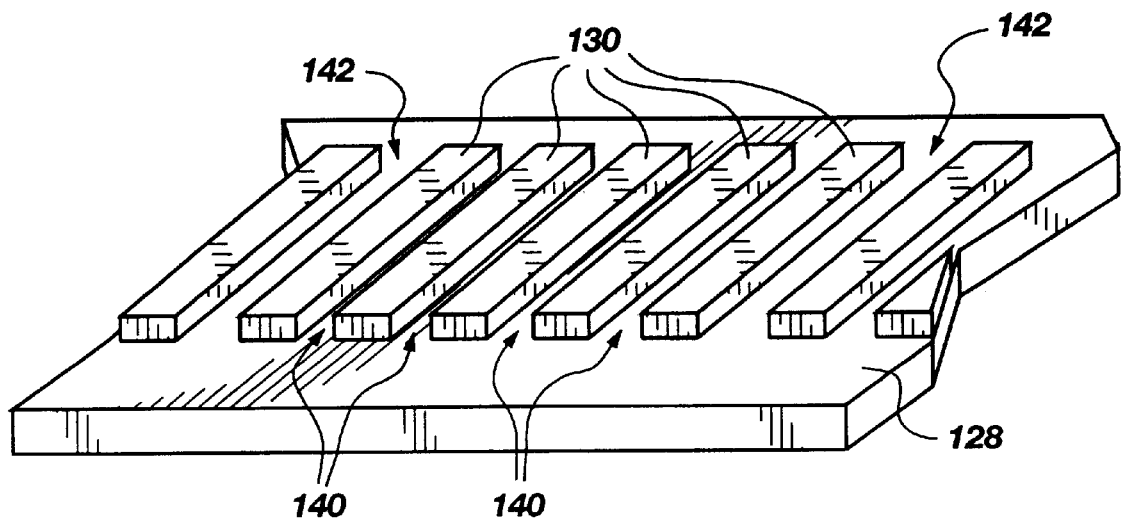
FIG. 6 illustrates an oblique view of another etching mask of the present invention.
Figure 7:
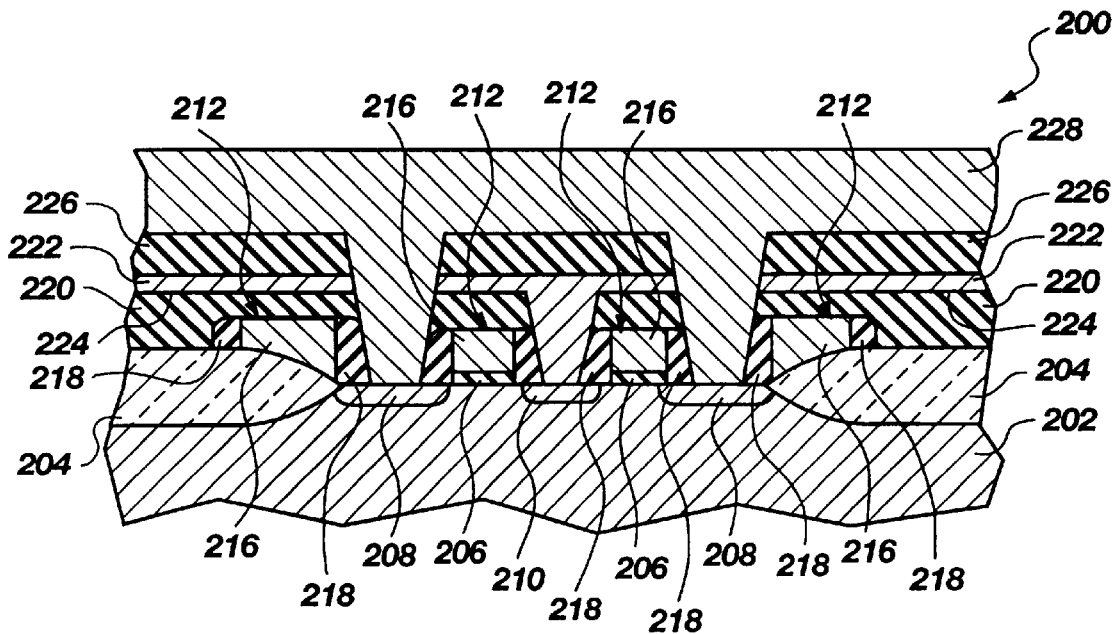
FIGS. 7–10 illustrate a prior art method of fabricating a capacitor for a memory cell.
Figure 8:
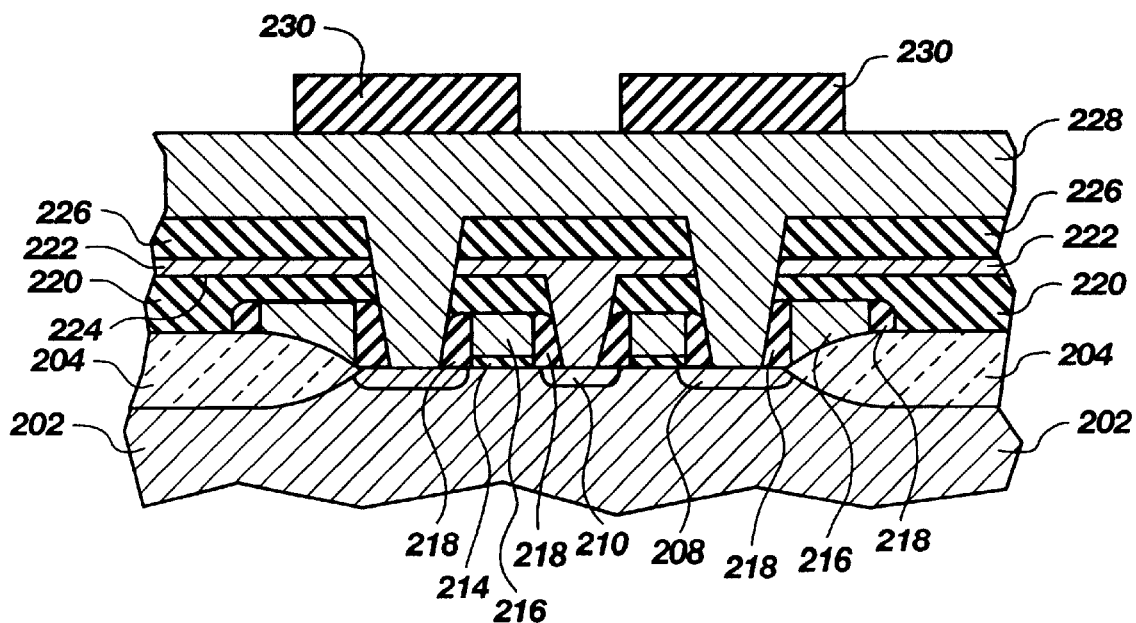
Figure 9:
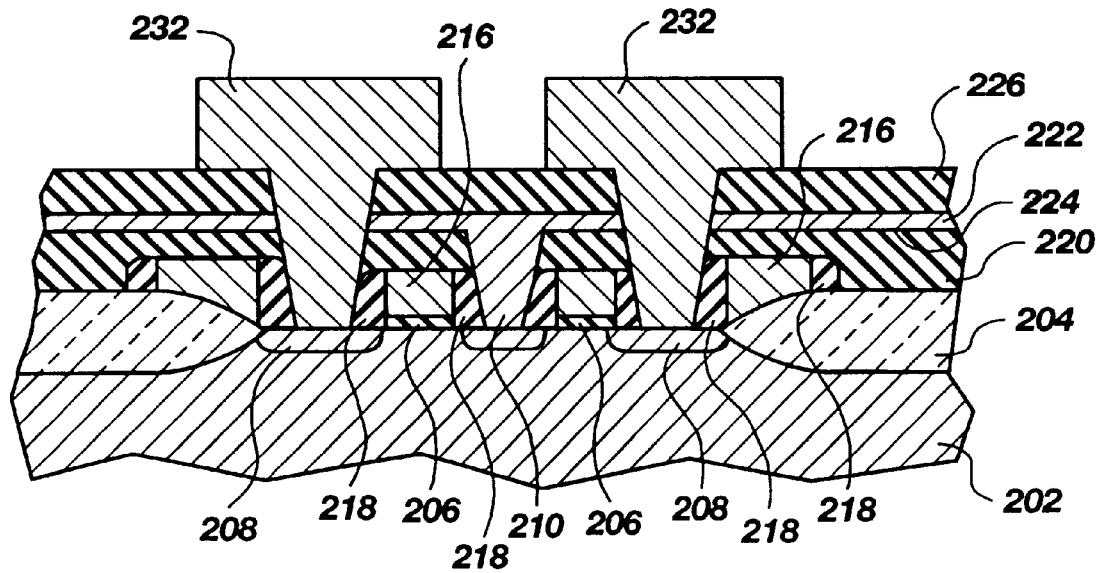
Figure 10:
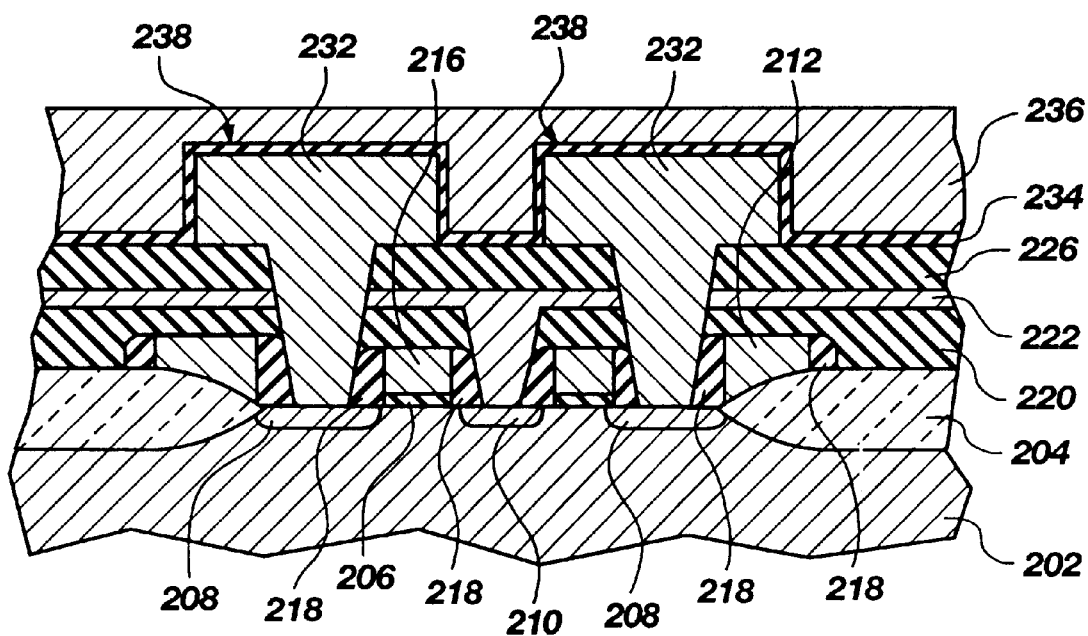

FIGS. 5 and 6 illustrate oblique views of two embodiments of the mask 130 as shown in FIG. 2. FIG. 5 illustrates an embodiment where the apertures 140 are holes through the mask 130 and the boundary openings 142 are avenues, wherein the diameter of the holes of the apertures 140 is smaller than the width of the avenues of the boundary openings 142. FIG. 6 illustrates an embodiment where both the apertures 140 and the boundary openings 142 in the mask 130 are avenues, wherein the avenues of the boundary openings 142 are wider than the avenues of the apertures 140.

This invention could also be used to fabricate decoupling and pump capacitors during the same processing steps as are used to form the cell capacitors of the array. This increase in capacitance would be advantageous for the decoupling and pump capacitors to save space on the die and potentially decrease the overall die size.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of producing a memory cell, comprising:
providing an intermediate structure comprising a substrate having at least one thick field oxide area, at least one implanted drain region, and at least one implanted source region; said intermediate structure further including at least one transistor gate member spanned between said at least one drain region and said at least one source region on an upper surface of said substrate; said intermediate structure further including a bitline within at least one layer of insulative material, wherein said bitline is in electrical communication with said at least one source region, and a storage poly layer on an upper surface of said at least one insulative material layer wherein a portion of said storage poly layer extends through said at least one insulative material layer to contact said at least one drain region;

applying an etch mask on said storage poly layer, wherein said etch mask includes a boundary opening for defining a storage poly node in said storage poly layer and includes at least one aperture positioned over said storage poly layer for forming at least one recess in said storage poly node;

simultaneously etching said storage poly layer through said boundary opening to form said storage poly node and through said at least one aperture to form said at least one recess in said storage poly node, wherein said simultaneously etching includes etching said storage poly layer through said boundary opening at a greater rate than etching said storage poly layer through said at least one aperture;

removing said etch mask;

applying a layer of capacitor dielectric on said storage poly node; and applying a layer of plate electrode material on said capacitor dielectric.

2. The method of claim 1, wherein said boundary opening is dimensionally larger than said at least one aperture.

3. A method of increasing a capacitive surface area and singulating a capacitor comprising:

providing a storage poly layer on an upper surface of a semiconductor device wherein a portion of said storage poly layer is in electrical communication with said semiconductor device;

applying an etch mask on said storage poly layer, wherein said etch mask includes a boundary opening for separating said storage poly layer into at least one storage poly node and includes at least one aperture positioned over said storage poly layer for forming at least one recess in said at least one storage poly node;

etching said storage poly layer through said boundary opening to form said at least one storage poly node and through said at least one aperture to form said at least one recess in said at least one storage poly node, wherein said etching includes etching said storage poly layer through said boundary opening at a greater rate than etching said storage poly layer through said at least one aperture;

removing said etch mask;

applying a layer of capacitor dielectric on said at least one storage poly node; and applying a layer of plate electrode material on said capacitor dielectric.

4. The method of claim 3, wherein said boundary opening is dimensionally larger than said at least one aperture.

5. A method of forming a storage poly node comprising:

providing a storage poly layer on an upper surface of a semiconductor device wherein a portion of said storage poly layer in electrical communication with said semiconductor device;

applying an etch mask on said storage poly layer, wherein said etch mask includes a boundary opening for separating said storage poly layer into at least one storage poly node and at least one aperture positioned over said storage poly layer for forming at least one recess in said at least one storage poly node;

etching said storage poly layer through said boundary opening to form said at least one storage poly node and through said at least one aperture to form said at least one recess in said at least one storage poly node, wherein said etching includes etching said storage poly layer through said boundary opening at a greater rate than etching said storage poly layer through said at least one aperture; and removing said etch mask.

6. The method of claim 5, wherein said boundary opening is dimensionally larger than said at least one aperture.

7. A method of producing a memory cell, comprising:

providing an intermediate structure comprising a substrate having at least one thick field oxide area, at least one implanted drain region, and at least one implanted source region; said intermediate structure further including at least one transistor gate member spanned between said at least one drain region and said at least one source region on an upper surface of said substrate; said intermediate structure further including a bitline within at least one layer of insulative material, wherein said bitline is in electrical communication with said at least one source region, and a substantially planar storage poly layer on an upper surface of said insulative layer wherein a portion of said storage poly layer extends through said at least one insulative material layer to contact said at least one drain region;

applying an etch mask on said substantially planar storage poly layer, wherein said etch mask includes a boundary opening for defining a storage poly node in said substantially planar storage poly layer and includes at least one aperture positioned over said substantially planar storage poly layer for forming at least one recess in said storage poly node;

simultaneously etching said substantially planar storage poly layer through said boundary opening to form said storage poly node and through said at least one aperture to form said at least one recess in said storage poly node, wherein said simultaneously etching includes etching said substantially planar storage poly layer through said boundary opening at a greater rate than etching said substantially planar storage poly layer through said at least one aperture;

removing said etch mask;

applying a layer of capacitor dielectric on said storage poly node; and applying a layer of plate electrode material on said capacitor dielectric.

8. The method of claim 7, wherein said boundary opening is dimensionally larger than said at least one aperture.

9. A method of increasing a capacitive surface area and singulating a capacitor comprising:

providing a substantially planar storage poly layer on an upper surface of a semiconductor device wherein a portion of said substantially planar storage poly layer is in electrical communication with said semiconductor device;

applying an etch mask on said substantially planar storage poly layer, wherein said etch mask includes a boundary opening for separating said substantially planar storage poly layer into at least one storage poly node and includes at least one aperture positioned over said substantially planar storage poly layer for forming at least one recess in said at least one storage poly node;

etching said substantially planar storage poly layer through said boundary opening to form said at least one storage poly node and through said at least one aperture to form said at least one recess in said at least one storage poly node, wherein said etching includes etching said substantially planar storage poly layer through said boundary opening at a greater rate than etching said substantially planar storage poly layer through said at least one aperture;

removing said etch mask;

applying a layer of capacitor dielectric on said at least one storage poly node; and applying a layer of plate electrode material on said capacitor dielectric.

10. The method of claim 9, wherein said boundary opening is dimensionally larger than said at least one aperture.

11. A method of forming a storage poly node comprising:

providing a substantially planar storage poly layer on an upper surface of a semiconductor device wherein a portion of said substantially planar storage poly layer is in electrical communication with said semiconductor device;

applying an etch mask on said substantially planar storage poly layer, wherein said etch mask includes a boundary opening for separating said substantially planar storage poly layer into at least one storage poly node and at least one aperture positioned over said substantially planar storage poly layer for forming at least one recess in said at least one storage poly node;

etching said substantially planar storage poly layer through said boundary opening to form said at least one storage poly node and through said at least one aperture to form said at least one recess in said at least one storage poly node, wherein said etching includes etching said substantially planar storage poly layer through said boundary opening at a greater rate than etching said substantially planar storage poly layer through said at least one aperture; and removing said etch mask.

12. The method of claim 11, wherein said boundary opening is dimensionally larger than said at least one aperture.

* * * * *